United States Patent [19]

Isobe

[11] Patent Number: 5,602,781
[45] Date of Patent: Feb. 11, 1997

[54] MEMORY DEVICE HAVING A PLURALITY OF SETS OF DATA BUFFERS

[75] Inventor: Tadaaki Isobe, Hadano, Japan

[73] Assignee: Hitachi, Inc., Tokyo, Japan

[21] Appl. No.: 405,126

[22] Filed: Mar. 16, 1995

[30] Foreign Application Priority Data

Mar. 17, 1994 [JP] Japan ................................. 6-046733

[51] Int. Cl.$^6$ ..................................................... G11C 7/00
[52] U.S. Cl. ............................... 365/189.05; 365/189.01; 365/230.08
[58] Field of Search ........................ 365/189.05, 189.12, 365/230.01, 230.08, 238.5, 189.01

[56] References Cited

U.S. PATENT DOCUMENTS

| | | | |
|---|---|---|---|
| 4,899,310 | 2/1990 | Baba | 365/189.05 |
| 5,268,873 | 12/1993 | Suzuki | 365/230.08 |
| 5,371,711 | 12/1994 | Nakayama | 365/189.05 |

FOREIGN PATENT DOCUMENTS

| | | |
|---|---|---|
| A60-136849 | 7/1985 | Japan . |
| A2-108259 | 4/1990 | Japan . |
| A4-324187 | 11/1993 | Japan . |

OTHER PUBLICATIONS

Nikkei Electronics, vol. 6.8, pp. 110–141, 1992, "The Design of CPU board in these days of 100 MHz".

"Proposition of Pseudo Vector Processor by Resister Windows and Super Scalar System," The Japan Symposium of Parallel Processing, JSPP '92 collection of papers, pp. 367–374.

"Examination of Micro Vector Processor Architecture," Information Processing Society of Japan, Research Report 92 ARC 94, pp. 17–24.

Primary Examiner—David C. Nelms
Assistant Examiner—Son Mai
Attorney, Agent, or Firm—Jenner & Block

[57] ABSTRACT

When a processor generates an access request to a plurality of continuous addresses to an RAM through a memory control apparatus, in order to enable a high speed process, a register which holds an address for accessing a memory cell and a register which holds an address for accessing a data buffer are separately provided in an RAM having memory cells and a plurality of row correspondence data buffers of the memory cells. A signal line to instruct the presence or absence of the use of the data buffer is provided between the processor and the memory control apparatus. The memory cell and the data buffer are accessed in parallel, thereby realizing a high processing speed. The processor designates so as to preferentially use the data buffer for an RAM access having an address continuity, thereby enabling the data to be accessed at a high speed.

14 Claims, 10 Drawing Sheets

READ (CASE OF ACCESSING TO MEMORY CELL/
NO REGISTRATION TO DATA BUFFER)

READ (CASE OF ACCESSING TO MEMORY CELL/
REGISTRATION TO DATA BUFFER)

READ (CASE OF ACCESSING TO DATA BUFFER)

WRITE (CASE OF ACCESSING TO MEMORY CELL/
NO RETURN AND WRITE TO DATA BUFFER)

WRITE (CASE OF ACCESSING TO MEMORY CELL/
RETURN AND WRITE TO DATA BUFFER)

WRITE (CASE OF ACCESSING TO DATA BUFFER)

WRITE (CASE OF ACCESSING TO MEMORY CELL/
REGISTER TO DATA BUFFER)

5,602,781

MEMORY DEVICE HAVING A PLURALITY OF SETS OF DATA BUFFERS

BACKGROUND OF THE INVENTION

The invention relates to a memory device constructing a memory apparatus and, more particularly, to a memory device suitable for a data processing apparatus of the type such that a large amount of data is supplied from a memory apparatus to a processor. Further, the invention relates to a data processing system configuration comprising a memory apparatus constructed by such a memory device, a memory control apparatus to control the memory apparatus, and processors.

In recent years, in association with the realization of a high operating speed of a microprocessor, the realization of a high operating speed and a high performance of peripheral devices which support the processor is remarkably progressed. For example, as memory devices, "synchronous DRAM", "Rambus-DRAM", "cache DRAM", etc. have been proposed as shown in "The Design of CPU board in these days of 100 MHz", Nikkei Electronics, Vol. 6.8, pages 110–141, 1992 (hereinafter, referred to as a literature 1). Those memory devices are selectively used in accordance with the application part or style in the system.

On the other hand, the performance of the microprocessor is remarkably improved in association with the progress of semiconductor technology and the development of RISC technique. Particularly, a product such that the operating frequency in a chip constructing the microprocessor exceeds 100 MHz has also been proposed owing to the progress of semiconductor technique. Due to the appearance of such a high speed microprocessor, the performance of a system using such a processor is also improved.

However, the following points are pointed out as problems when realizing such a system. Generally, in a process which can be operated in the microprocessor and a cache memory which is arranged therearound and can operate at a high speed, such a high speed performance can be sufficiently effectively used. When the user tries to solve a large scale problem as seen in technical calculations, data to be handled cannot be fully stored in the cache memory, so that a problem such that the performance extremely deteriorates occurs. Namely, since a cache miss occurs, a waiting state of the processor occurs by only a time that is required to transfer the data from a main memory apparatus (or memory apparatus of a lower hierarchy) to the cache, so that the processor enters an idle state and the performance of the system remarkably deteriorates. A degree of such a deterioration in performance has been shown in FIG. 7 and the like of "Proposition of Pseudo Vector Processor by Register Windows and Super Scalar System", The Japan Symposium of Parallel Processing, JSPP'92 collection of papers, pages 367–374 (hereinafter, referred to as a literature 2). According to the pseudo vector processor which has been proposed in the above literature in order to cope with the problem such that the data cannot be fully stored in the cache memory, there is used a device such that the memory accesses to the main memory apparatus (or memory apparatus of the lower hierarchy) are operated like a pipeline, thereby minimizing the deterioration in performance due to the waiting time of the data.

The performance that is required for the main memory apparatus (or memory apparatus of the lower hierarchy) in this case is extremely higher than that of the main memory apparatus (or memory apparatus of the lower hierarchy) of a general microprocessor system using the cache. This is because according to an approach of such a pseudo vector processor, for an increase in latency of the access to the main memory apparatus (or memory apparatus of the lower hierarchy), it is intended to conceal such an increase in latency by using a pipeline structure and it is not intended to reduce an amount of data to be handled. The main memory apparatus (or memory apparatus of the lower hierarchy) for the pseudo vector processor, therefore, needs to have a multi-bank (a group of memory cells which can be independently operated) configuration in which a plurality of memory devices having a high speed interface such as a synchronous DRAM are arranged in parallel in order to realize a large capacity and a high throughput.

In addition to the pseudo vector processors, needs for the main memory apparatus (or memory apparatus of the lower hierarchy) of a large capacity and a high throughput are increasing. As a technique different from the above architecture, there can be mentioned an approach shown in "Examination of Micro Vector Processor Architecture", Information Processing Society of Japan, Research Report 92-ARC-94, pages 17–24 (hereinafter, referred to as a literature 3). According to such an approach, for a problem of decrease in memory access pipeline by an IO pin neck which occurs in the case where the functions of the vector processor are constructed by one chip by realizing a high integration, by executing multi-thread processes of the vector instruction level, an effective deterioration of the memory accessing performance is prevented. In this case as well, a request of the throughput for the main memory apparatus (or memory apparatus of the lower hierarchy) is high. As a system, accordingly, it is necessary to prepare the main memory apparatus (or memory apparatus of the lower hierarchy) with the multi-bank configuration in a manner similar to the pseudo vector processor.

A common point in the systems using the architectures like the above two examples is that it is necessary to cheaply realize the main memory apparatus (or memory apparatus of the lower hierarchy) of a large capacity and a high throughput by an amount of component elements of a small scale. Namely, a memory system has to be provided in accordance with a tendency such that the processor itself intends to realize a small size and low costs. Unless such a memory system can be realized, a balance as a system cannot be obtained and the value of the existence as a system is extinguished.

SUMMARY OF THE INVENTION

Even in case of realizing the system of the architecture of either one of the "pseudo vector processor" and the "micro vector processor" mentioned above, it is a key how to provide such a main memory apparatus (or memory apparatus of the lower hierarchy) of the high performance.

A case of realizing the main memory apparatus (or memory apparatus of the lower hierarchy) of the high performance by the high speed DRAM described in the literature 1 will now be considered. First, "cache DRAM" cannot be applied to the system because a smallness of the cache capacity causes a problem. "Rambus-DRAM" is a device which exhibits an effect of a high speed in case of continuously accessing a large quantity of data and is not suitable to an application for realizing the main memory apparatus (or memory apparatus of the lower hierarchy) such that the access corresponding to each operand from the processor is processed at a high speed.

To realize the main memory apparatus (or memory apparatus of the lower hierarchy) of a high throughput by the conventional technique, it is most effective to adopt the system having the multi-bank configuration using "synchronous DRAM". FIG. 2 shows an example of a system configuration in such a case. FIG. 3 shows a constructional diagram of a conventional synchronous DRAM (internal: 1-bank construction). Registers 310, 311, 312, and 314 in the DRAM hold corresponding signals of row-address, column-address, data-in, and data-out by using a clock that is supplied from the outside of the chip as a trigger. Reference numeral 320 denotes a decoder of row-address; 321 a decoder of column-address; 300 a memory cell itself; and 301 a control circuit for generating set signals to the address registers 310 and 311, set signals 301a/301b of the write data register 312, a set signal to the read data register 314, and a write instruction signal to the memory cell 300 from control signals CS, RAS, CAS, and WE. It is a feature of the synchronous DRAM that an external interface of the DRAM has been pipelined. That is, an interface which can perform a synchronous transfer based on a sync clock is constructed between a control logic (memory control apparatus) of the DRAM and the DRAM. Therefore, the synchronous DRAM corresponding to a plurality of banks can be connected onto a set of memory interfaces.

Thus, the multi-bank can be constructed by an amount of component elements of a smaller scale than that in case of using the asynchronous DRAM as shown in FIG. 2. Reference numeral 200 denotes an instruction processor, 210 a memory control apparatus, and 220 a memory apparatus. A control circuit 211 to distribute a memory access request to two sets of RAMs is provided in the memory control apparatus. Every four synchronous DRAMs 221 to 224 and 225 to 228 are connected to the interface with each memory apparatus. In this case, addresses are allocated so as to move on the DRAMs every word address as described in the memory apparatus 220. Such an approach, however, is not the optimum way because of the following reasons.

In the "pseudo vector processor", as shown at page 371 of the literature 2, iterations such as to construct a DO loop are sequentially executed. Therefore, since the operation such that one vector operand is continuously accessed as in the general vector processor is not executed, the access is discontinuously performed to the main memory apparatus (or memory apparatus of the lower hierarchy). Namely, as shown in FIG. 4 of the literature 2, an access pattern such as "a(i+2)→b(i+2)→a(i+3)→b(i+3)" is executed. Even if a vector "a" and a vector "b" have been stored in a continuous area, the access addresses to the memory system are not continuous.

On the other hand, in the "micro vector processor" shown in the literature 3, the execution of the multi-thread process of the vector command level has been proposed. Even in such a vector processor, accesses corresponding to the vector operands of a plurality of streams mixedly exist. Even if the operand of each stream has been allocated to the continuous area, therefore, the access addresses to the main memory apparatus (or memory apparatus of the lower hierarchy) are not continuous. This is the reason why the approach shown in FIG. 2 is not optimum.

As mentioned above, the memory system in the case where a high throughput is required irrespective of a fact that the addresses of the memory accesses are not continuous cannot help adopting a construction such that a large number of banks are prepared except the system using a large number of high speed RAMs such as to be used for cache. This is because the performance itself of the memory cells of various kinds of DRAMs is not so largely improved even if a fine pattern forming technique of a semiconductor process is progressed and so long as the continuous accesses are not executed for the RAM, the RAM cannot obtain a benefit of the high speed function of the DRAM itself. Namely, although the high speed of the RAM interface portion can be accomplished by the use of the synchronous DRAM, if it is necessary to access to discontinuous addresses, a request on the processor side cannot be satisfied by a method other than an increase in number of banks.

Therefore, even if continuity of the addresses exists in the inherent memory access pattern of the processor, its characteristics cannot be effectively used and it is necessary to prepare the main memory apparatus (or memory apparatus of the lower hierarchy) constructed by the multi-banks. There occurs a problem such that an amount of hardware component of the system is not smaller than a compact size of the processor. FIG. 2 shows an example of an arrangement on the memory in the case where accesses of continuous addresses (a0, a1, a2, a3, . . .) and (b0, b1, b2, b3, . . .) mixedly exist. A stream 201 and a stream 202 are mixed in 203 and are sent as they are to the memory control apparatus 210 and processed.

As mentioned above, when the accesses mixedly exist, an access pattern near a random state occurs for the memory system. The feature of the DRAM such that it is strong for the continuous accesses cannot be effectively used. Assuming that the DRAM has eight machine cycles, the DRAM cannot cope with an access request of each cycle from the processor unless at least eight banks are prepared.

On the other hand, a system having a data buffer in the DRAM has been proposed as an invention which leads to provide one of solutions for the foregoing problem such that the continuous accesses of a plurality of groups mixedly exist. Such an invention has been shown in prior art 1, "Memory Circuit" (JP-A-2-108259) or prior art 2, "Dynamic RAM" (JP-A-4-324187). It is an object of the above prior art invention that a plurality of data buffers corresponding to rows are provided in the DRAM and a plurality of accesses which are generated at random for a plurality of pages (ROW addresses) are processed at a high speed. According to the prior arts shown here, a using construction in the system is obscure and in case of actually examining the application to the system and utilizing the advantage, the following problems occur.

First, the prior art doesn't assumes the application to the system such that a large amount of single access from the processor or the like is processed. Therefore, the system has a structure on the assumption that the data is held in the data buffers corresponding to the rows, so that efficient processes cannot be expected in the case such that the accesses to the row correspondence data buffers and the memory cells mixedly exist. When considering from another viewpoint, it can be also said that a concept of an out-of-order process doesn't exist in a plurality of accesses to the same RAM. The same shall also similarly apply to the prior arts 1 and 2.

Indeed, the order has to be held with respect to the accesses to the same address in the memory access. However, such a necessity doesn't essentially exist so long as different addresses. For example, when seeing as a single RAM itself, an RAM having two banks in the chip like an SDRAM (page 124, FIG. 3, of the literature 1) also exists. Fundamentally, there is no limit in the access executing order among the banks. Even in an example at the system level, the pseudo vector processor system of the literature 2 presumes a multi-interleave memory apparatus and has a structure such that it is not aware of the order among the access requests among the ways.

Generally, in a mechanism such that the order of the memory accesses is not guaranteed at the system level, there is a method whereby the memory control apparatus is provided with a rearrangement buffer using an access request identifier to absorb a reversal of the accessing order (memory control system; JP-A-60-136849) or a method whereby register numbers on the storage destination side in a processor are also always carried around in the memory control apparatus and, after the data was stored, a status of the register is changed to a valid status, thereby processing a data reference without a contradiction. According to both of those methods, even when the order of the memory accesses generated from the processor doesn't coincide with the executing order in the memory, the processes as a system can be executed without a contradiction.

On the other hand, when considering the processes in the system, if access requests are generated from a plurality of request sources, in case of access requests from request sources such that an influence (penalty) on the performance due to a long latency can be almost ignored, there is a case where it is desirable on the performance to directly access the memory cells. On the other hand, in the access from the processor, when accesses of vector variables and accesses of scalar variables mixedly exist, the memory cells have to be directly accessed with respect to the scalar variables. Even in the vector variables, when the number of variables is larger than the number of row correspondence data buffers, the memory should directly be accessed with regard to the variable in which an access frequency is low. In case of directly accessing to the memory cell, however, if the data is registered into the row correspondence data buffers and is accessed, the data to be inherently accessed at a high speed is got out from such a buffer. An efficiency of the processes is extremely deteriorated as a system.

It is, therefore, necessary to make it possible to selectively process the fetching to the row correspondence data buffer and the direct access to the memory cell. Obviously, the direct access to the memory cell and the access to the row correspondence data buffer of a different resource in the chip need to be performed in parallel. This is because, generally, in case of accompanying the access to the memory cell, a long time is necessary and there is no need to stop another access in vain for a period of time during which such an access is executed.

The prior art doesn't take into consideration of the application to the SDRAM constructed by a plurality of banks. However, in a future high speed system, it is necessary to fetch the function into a synchronizing type DRAM and its realizing method is also extremely significant.

The present invention has the following objects under such circumstances as mentioned above.

It is an object of the invention that in a memory device having a plurality of memory cells each of which is accessed by a row address and a column address and a plurality of data buffers each for holding a part or all of data read out by the row address, wherein even in the case where accesses to the row correspondence data buffers and to the memory cells mixedly exist, they can be efficiently accessed.

Another object of the invention is that in a synchronous type memory device having a plurality of memory cells each of which can be independently accessed by a row address and a column address and having a synchronous type interface for pipelining an interface with an outside and processing, wherein designated data can be accessed (read out, written) at a high speed.

Still another object of the invention is that in the access to a memory device having a plurality of memory cells each of which is accessed by a row address and a column address and a plurality of data buffers each for holding a part or all of data read out by the row address, even in the case where accesses of vector variables and accesses of scalar variables mixedly exist, namely, in the case where characteristics of the addresses to be accessed differ, the accesses can be efficiently executed.

Further another object of the invention is that a plurality of processors can mutually efficiently transmit and receive data through a memory device having a plurality of memory cells each of which is accessed by a row address and a column address and a plurality of data buffers each for holding a part or all of data read out by the row address.

The reason why in spite of the fact that there is a possibility such that the addresses of the memory accesses can be made continuous in the processor, the addresses to the main memory apparatus (or memory apparatus of the lower hierarchy) are discontinuous is because requests of a plurality of vector operand streams are allowed to mixedly exist and the access requests are generated. Such a mixture existence itself is a processing system that is necessary to perform the processes in the processor at a high speed and it is meaningless to examine a method of avoiding such a mixture existence itself. Therefore, a method of realizing a system for extracting a continuity from the access requests which are discontinuously generated matches with a method of realizing a high processing speed of the processor. Generally, in the DRAM, the data at the location designated by the column address in the row designated by the row address is accessed.

From this viewpoint, in order to accomplish the above objects, a plurality of data buffers are provided in the DRAM in correspondence to the rows and a mechanism to hold access data in correspondence to different row addresses is also provided. In case of writing, there is provided a mechanism such that the data of the row which was once designated is read out and held in the plurality of data buffers and is rewritten to the data to be updated on such a data buffer, and at a time point when the data buffer including the updating information is allocated to another row, the information of such a data buffer is returned and written into the memory cell. To effectively using the area in the RAM chip, it is proper to realize the data buffer for reading and the data buffer for writing in a commonly sharing manner. Further, the address registers to access the memory cells and the address registers to access the plurality of row correspondence data buffers are individually provided in the DRAM. The address registers corresponding to the data buffers don't need to be provided only for the plurality of data buffers but it is also possible to use a system such that they can be shared among the data buffers.

An interface to notify information indicating whether the access is an access to the data to be held into the row correspondence data buffer or not to the memory control apparatus is provided for the processor. Similarly, an interface to notify information indicating whether the access is, an access to the data to be held in the row correspondence data buffer or not to the memory control apparatus is also provided for the input/output control apparatus.

A table to manage that the data in which row address has been held in which data buffer in the DRAM is provided for the memory control apparatus and a mechanism to decide the data buffer position to be replaced in the case where there is no empty data buffer is provided.

For the synchronous DRAM having therein a plurality of banks, there are provided a row correspondence data buffer that is shared among a plurality of banks, a selecting circuit for storing from outputs of the plurality of banks into the relevant buffer, and a bus to selectively return and write data from the relevant buffer into a target bank.

In the case where the memory access requests corresponding to a plurality of streams are mixedly generated from the processor, information indicating that the relevant access is a request constructing a stream (a bundle of continuous accesses) and should be fetched into the row correspondence data buffer in the RAM is first supplied to the memory control apparatus. In the case where the access is made from the input/output control apparatus, if the access speed from the processor is raised by fetching the data corresponding to the relevant access request into the row correspondence data buffer, an instruction to fetch such data is supplied to the memory control apparatus.

On the basis of the above information, the memory control apparatus judges whether the data has already been fetched in the row correspondence data buffer in the RAM indicated by the request address or not. If NO, the relevant data is newly allocated into the row correspondence data buffer. The memory control apparatus updates the table indicating that the information of which address has been registered in each row correspondence data buffer. The memory control apparatus also adds the row correspondence data buffer number and generates an access request to the RAM. In case of the new registration to the row correspondence data buffer in which the access indicates the reading, the reading operation from the memory cell is instructed to the RAM. The return of the read-out data to the memory control apparatus and the registration into the row correspondence data buffer in the RAM are instructed. On the other hand, in case of the new registration in which the access indicates the writing, the writing of the data into the memory cell is first instructed. After the data was written, the updated data is registered into the row correspondence data buffer.

In the case where the data corresponding to the request from the processor has been registered in the corresponding RAM, the memory control apparatus adds the relevant row correspondence data buffer number and generates the access request to the RAM. In the case where the access indicates the reading and the relevant data has already been registered in the row correspondence data buffer, the row correspondence data buffer number and the address in the buffer are sent to the RAM and the reading of the data is instructed. In this case, the data can be read out at a high speed without accessing the memory cell. On the other hand, in the case where the access indicates the writing and the information of the relevant address has already been registered in the row correspondence data buffer, the row correspondence data buffer number, the address in the buffer, and the updating data are sent to the RAM and are changed to the updating data on the row correspondence data buffer. The reflection of the updated information to the memory cell is executed by returning and writing the data into the memory cell when the relevant data buffer is allocated to another address and is replaced.

The row correspondence data buffer in the RAM can be also commonly used in the reading/writing modes. Thus, the area in the RAM chip can be reduced or, in the case where the reading/writing ratio is one-sided, the processes can be efficiently executed.

Further, two kinds of address registers/data registers for writing are provided in correspondence to the memory cells and to the row correspondence data buffer group. Thus, even when the memory cell is being accessed by the precedent RAM access and the corresponding address register/data register for writing is in use, the access to the row correspondence data buffer can be executed. The effective access performance of the RAM can be improved.

In the synchronous DRAM of the sync type interface having a plurality of banks, the row correspondence data buffer is shared among a plurality of banks. The row correspondence data buffer is controlled in a manner similar to the case where the inside of the RAM is constructed by one bank. The row correspondence data buffer has a read data bus from the plurality of banks and a write bus to the plurality of banks. A high speed access in which the memory cell access using the shared row correspondence data buffer is bypassed is realized.

DESCRIPTION OF THE PREFERRED EMBODIMENT

Figure 1:
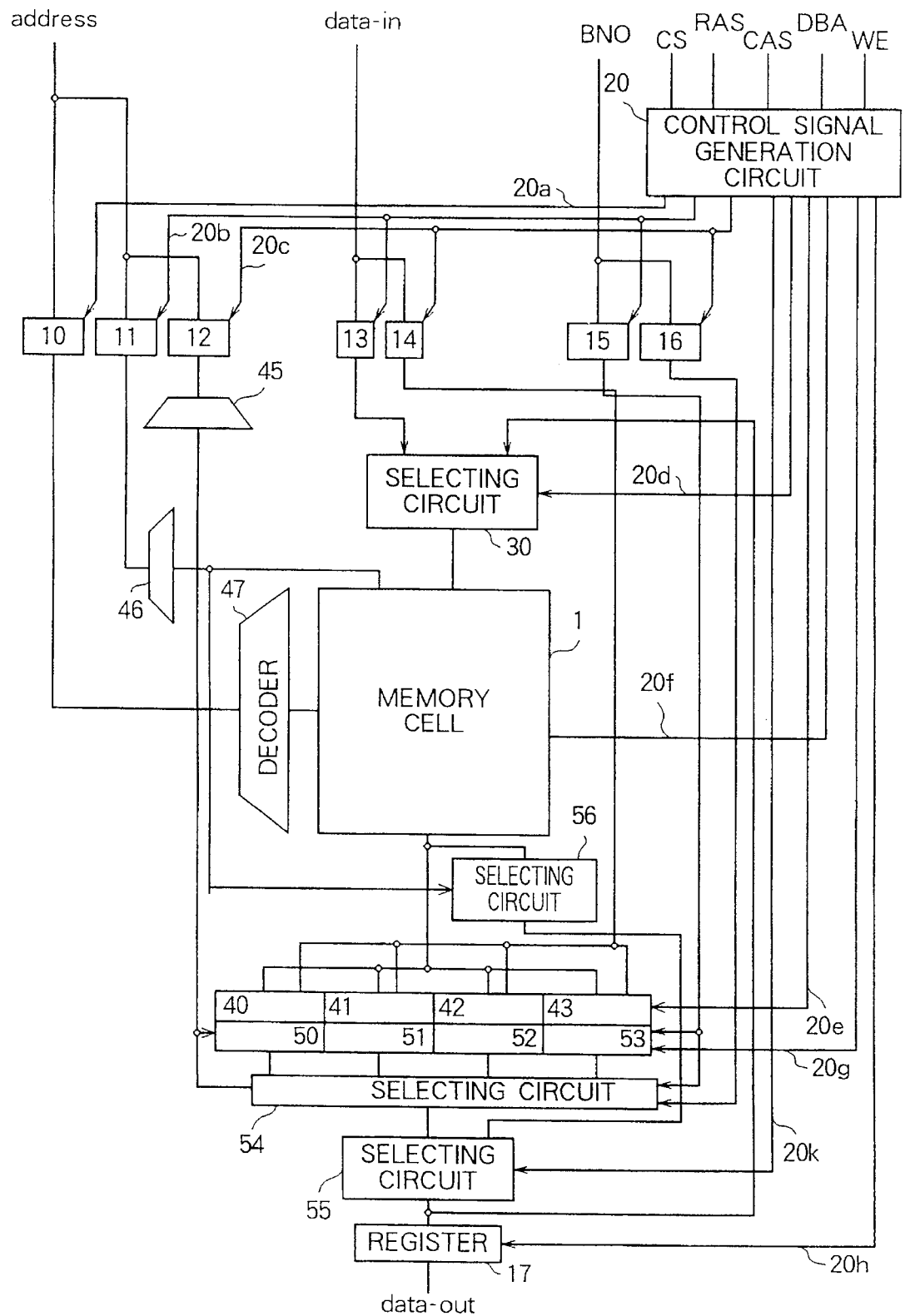
FIG. 1 is a diagram showing an internal construction of an RAM to which the invention is applied.

FIG. 1 shows a construction of an RAM to which the invention is applied. The RAM comprises: a memory cell group 1; a plurality of data buffers 50 to 53 corresponding to rows for the memory cell group; a selecting circuit 54 to select data from the plurality of data buffers in accordance with data buffer number information; a data selecting circuit 30 in case of returning and writing the contents in the data buffer into the memory cell; a row-address decoder 47; column_address decoders 46 and 45; a register 10 for row-address; registers 11/12 for column-address; registers 13/14 for write data; registers 15/16 for data buffer number; a read data register 17; and a control circuit 20 for generating a set signal to each register and a selection instruction signal to the selecting circuit. The signals (address, data-in, data-out, BNO, CS, RAS, CAS, DBA, WE) are the signals in the RAM and do not always correspond to external terminals of the RAM in a one-to-one corresponding manner. For instance, the external terminals regarding the data-in and data-out can be also set to one terminal as necessary.

As variations of the operations regarding READ/WRITE of the RAM shown in FIG. 1, the following operations are specified.

[READ]

1) Read-out from the memory cell in which the registration to the data buffer is not performed.

2) Read-out from the memory cell in which the registration to the data buffer is executed.

3) Read-out from the data buffer.

[WRITE]

1) Write into the memory cell which is not concerned with the data buffer.

2) Return and write of the contents of the data buffer into the memory cell.

3) Update of the data on the data buffer.

4) Write into the memory cell and register into the data buffer.

Figure 5A:
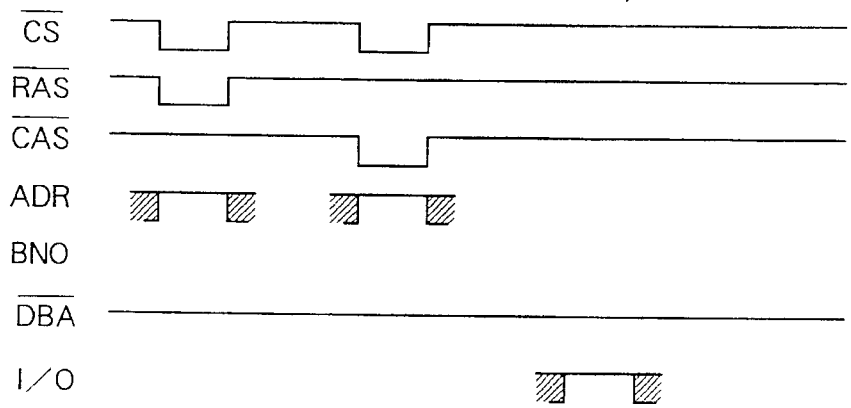
FIGS. 5A, 5B, and 5C are time charts showing the reading operation of the RAM proposed by the invention when it is seen from input and output signals.
Figure 5B:
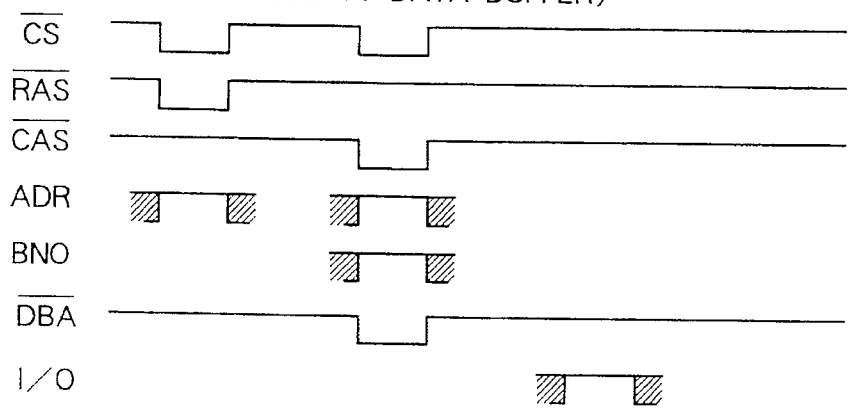
Figure 5C:
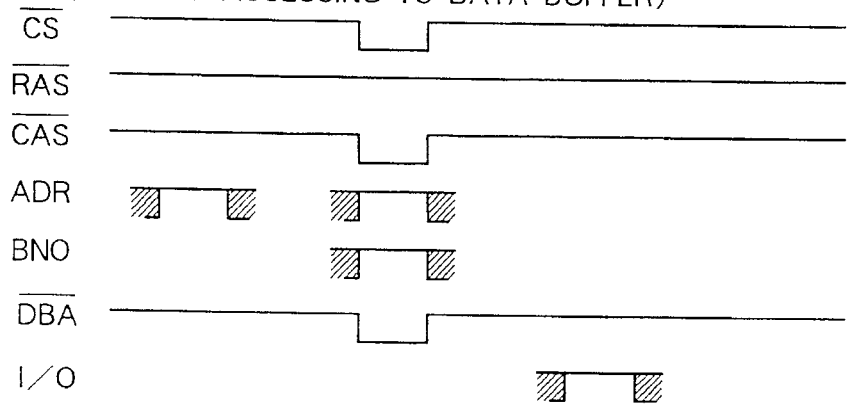

FIGS. 5A to 5C and FIGS. 6A to 6D show the operation time charts expressed by interface signals of the RAM. FIGS. 5A to 5C relate to the reading case (READ). FIGS. 6A to 6D relate to the writing case (WRITE). The operation of the RAM to which the invention is applied shown in FIG. 1 will now be described hereinbelow with reference to the time charts.

The READ operation will be first explained with reference to FIGS. 5A to 5C.

FIG. 5A: Reading operation from the memory cell in which the registration into the data buffer is not performed (hereinafter, referred to as a first READ operation)

First, the address is fetched into the row address register 10 by a set signal 20a produced from the CS (chip select)/RAS (row address strobe) signals. The fetched row address is decoded by the decoder 47 on the row side. The operation to read out the row data from the memory cell is activated on the basis of the decoded value.

On the other hand, the address is fetched into the COL (column) address register 11 for memory cell access by a set signal 20b produced from the CS/CAS signals. The fetched COL address is decoded by the decoder 46 and is supplied to the selecting circuit 56 arranged on the downstream of the memory cell.

In the selecting circuit 56, the read-out row data is retrieved by the COL decoded address and the read data is decided. The decided read data passes through a selecting circuit 55 to select an output from the data buffer group and an output from the selecting circuit 56 and is set into the read data register 17. After that, the read data is outputted to the outside of the RAM. A selection instruction signal 20k of the selecting circuit 55 is produced by the control circuit 20 so as to select the output of the selecting circuit 56 under a condition such that the access is an RAM access associated with CS/RAS. The first READ operation (case of accessing to the memory cell/no registration to the data buffer) is finished in this way.

FIG. 5B: Reading operation from the memory cell in which the registration into the data buffer is executed (hereinafter, referred to as a second READ operation)

The read data is read out from the memory cell in a manner similar to the first READ operation. The second READ operation differs from the first READ operation with respect to a point that the data of one row is stored to the buffer location designated by BNO (buffer number: information which designates the data buffer number, namely, data buffer identifier to select one of the plurality of data buffers) of the data buffer group 50 to 53 by DBA (data buffer access) and BNO which were designated simultaneously with CAS (column address strobe). Since CAS, DBA, and BNO are simultaneously used, they are set to different terminals among the external terminals of the memory device.

The BNO information is fetched into the BNO register 15 for memory cell access by the set signal 20b produced from the CS/CAS signals by the control circuit 20. The fetched information indicates to which position in the data buffer group 50 to 53 the data read out from the memory cell 1 is stored. A selection instruction signal 20e produced by the control circuit 20 from the CS/CAS/DBA signals instructs the selection of the read data to selecting circuits 40 to 43 for selecting either one of the read data and write data.

The data read out from the memory cell 1 is stored into the data buffers 50 to 53 through the selecting circuits 40 to 43 as mentioned above. In parallel with the storing operations, the read data is outputted to the outside of the RAM via the selecting circuits 56/55. However, such operations are similar to the first READ operation. The second READ operation (case of accessing to the memory/there is the registration into the data buffer) is finished in this way.

FIG. 5C: Reading operation from the data buffer (hereinafter, referred to as a third READ operation)

The third READ (case of accessing to the data buffer) operation is started by directly supplying the CS/CAS/DBA signals to the RAM without generating the CS/RAS signals. In this case, the address signal is fetched into the COL address register 12 for accessing the data buffer and the BNO signal is fetched into the BNO register 16 for accessing the data buffer by the CS/CAS signals. The address fetched in the COL address register 12 is decoded by the column address decoder 45 and is supplied to the data buffers 50 to 53. The information fetched in the BNO register 16 is supplied to the selecting circuit 54 of the output of the data buffer. Thus, the data selected by the output of the COL address register 12 from the data buffers 50 to 53 is extracted through the selecting circuit 54 and is set into the read data register 17. A set signal 20h to the register 17 is produced by the control circuit 20 by the CS/CAS signals and is instructed. The third READ operation (case of accessing to the data buffer) is finished in this way.

The writing operation will now be described with reference to FIGS. 6A to 6D.

Figure 6A:
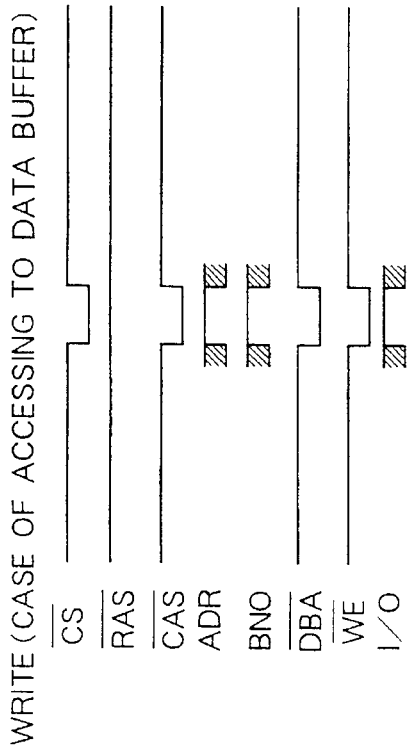
FIGS. 6A, 6B, 6C, and 6D are time charts showing the writing operation of the RAM proposed by the invention when it is seen from the input/output signals.

FIG. 6A: Writing operation to the memory cell which is not concerned with the data buffer (hereinafter, referred to as a first WRITE operation)

In the first WRITE (case of accessing to the memory cell/no return and write of the data buffer) operation, the address is first fetched into the row address register 10 by the set signal 20a produced from the CS/RAS signals. The row address fetched there is supplied to the memory cell 1 through the decoder 47 on the row side. The operation to write the write data that is supplied from the selecting circuit 30 into the memory cell designated by the relevant row address is activated for the memory cell 1.

Subsequently, the address is fetched into the COL address register 11 for accessing the memory cell by the set signal 20b produced from the CS/CAS signals. The fetched COL address is supplied to the memory cell 1 through the decoder 46.

At the same time the address is fetched into the COL address register 11 for accessing the memory cell, the write data is fetched into the write data register 13 for accessing the memory cell by the set signal 20*b*. The fetched write data is supplied to the memory cell via the selecting circuit 30. The selecting circuit 30 selects either one of the write data from the data register 13 and the write data from the selecting circuit 55 and is controlled by a selection instruction signal 20*d* that is produced by the control circuit 20 from the CS/CAS/DBA signals. In this case, the write data from the data register 13 is selected.

After that, a write instruction to the memory cell 1 is produced from the control circuit 20 from the WE (write enable) signal and is supplied as a write instruction signal 20*f* to the memory cell 1. The first WRITE operation is finished.

Figure 6B:
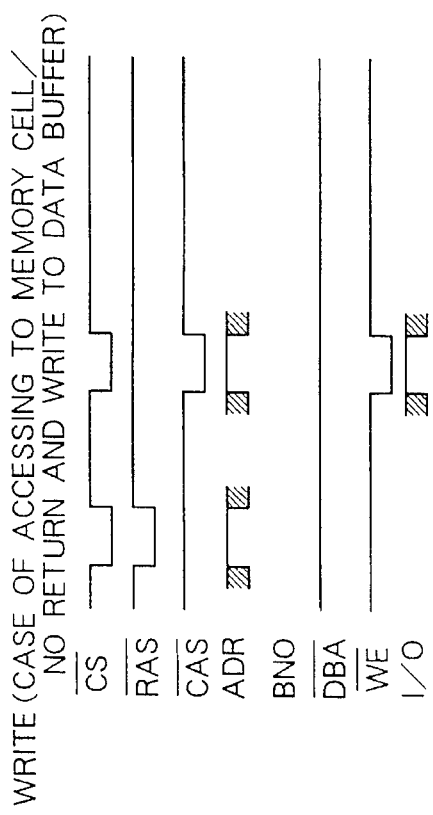

FIG. 6B: Returning and writing operation of the contents of the data buffer into the memory cell (hereinafter, referred to as a second WRITE operation)

The second WRITE (case of accessing to the memory cell/returning and writing the data buffer) operation is executed in a manner similar to the first WRITE operation. The second WRITE operation, however, differs from the first WRITE operation with respect to a point that the data of one of the data buffer group is written into the memory cell. Therefore, the BNO information is fetched into the BNO register 15 for accessing the memory cell at the same timing as the timing for fetching the COL address into the register 11. The fetched information is supplied to the selecting circuit 54 from the data buffer group. The data in the designated data buffer is supplied to the write data selecting circuit 30 via the selecting circuit 55. The output data is supplied to the memory cell and is written. The second WRITE operation is finished in this way. Since the COL address and the BNO information are simultaneously fetched, the terminal to receive the COL address and the terminal to receive the BNO information are different terminals.

Figure 6C:
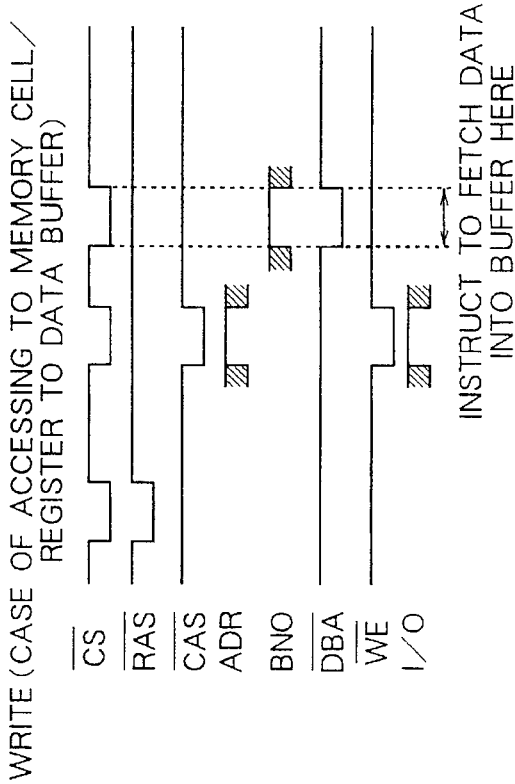

FIG. 6C: Updating operation of the data on the data buffer (hereinafter, referred to as a third WRITE operation)

The third WRITE (case of accessing to the data buffer) operation is the operation to update the data registered in the data buffer. The third WRITE operation is started by supplying the CS/CAS/DBA signals to the data buffer without generating the CS/RAS signals to the RAM. In this case, the address signal is fetched into the COL address register 12 for accessing the data buffer and the BNO signal is fetched into the BNO register 16 for accessing the data buffer by the CS/CAS signals. At the same time, the updating information is fetched into the data register 14 for accessing the data buffer.

In the third WRITE operation, the data at the bit position shown by the COL address register 12 in the data buffer shown by the BNO register 16 is replaced to the contents of the write data buffer 14. In this case, the selection instruction signal 20*e* produced from the CS/CAS/DBA signals is supplied to the selecting circuits 40 to 43 provided at the upper stage of the data buffers 50 to 53. The data buffer is updated by a write instruction signal 20*g* produced from the DBA/WE signals. The third WRITE operation is finished in this way.

Figure 6D:
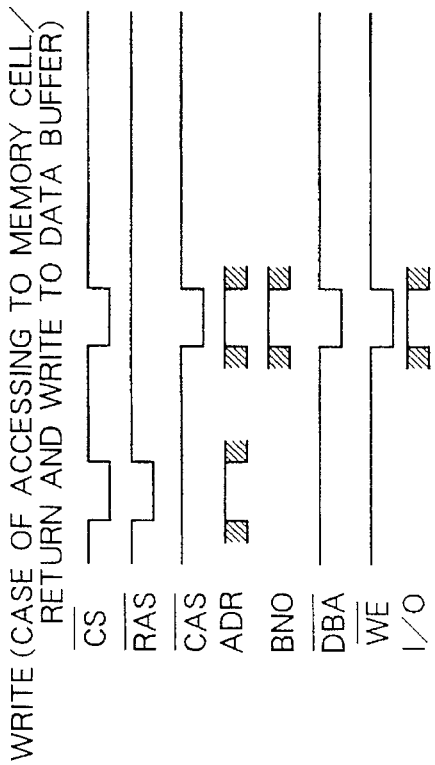

FIG. 6D: Writing to the memory cell and registering operation to the data buffer (hereinafter, referred to as a fourth WRITE operation)

The fourth WRITE operation is the operation to register the write data of one relevant row into the data buffer simultaneously with the writing (updating) to the memory cell.

Until the writing into the memory cell 1, the operations are executed in a manner similar to the first WRITE operation. After the CS/CAS/WE signals were supplied to the RAM, the data is fetched into the data buffer shown by BNO designated in this instance by the CS/DBA signals which are not associated with the RAS/CAS signals. The BNO information is fetched into the BNO register 15 for accessing the memory by the set signal 20*b* produced from the CS/DBA signals. The fetched information is used to instruct the locations in the data buffer group 50 to 53 to be stored. The read data is stored into the data buffers 50 to 53 via the selecting circuits 40 to 43 by the set signal 20*g* produced from the CS/DBA signals. The fourth WRITE operation is finished in this way.

Figure 8:
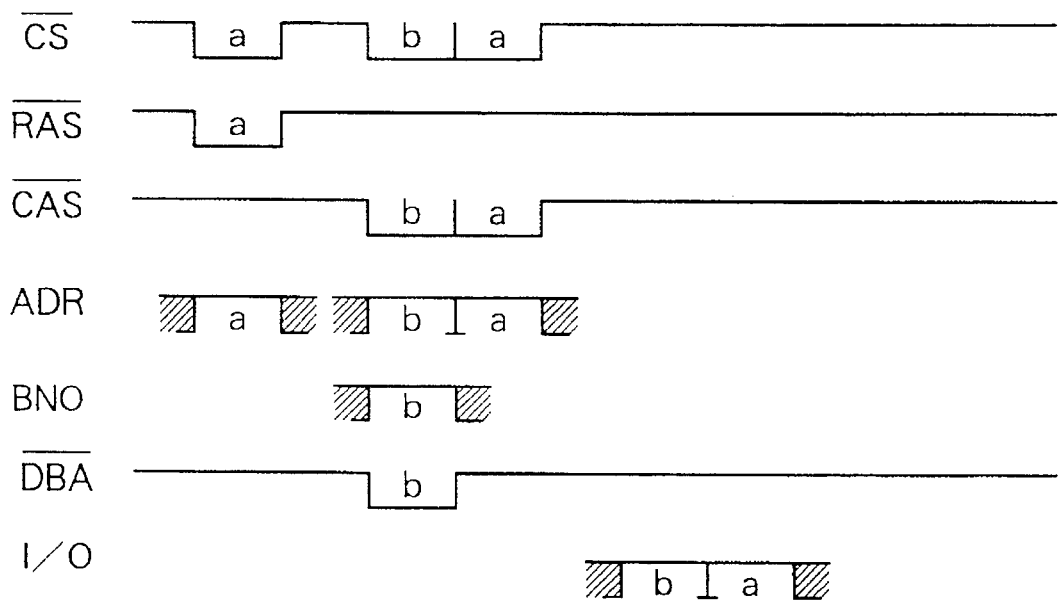
FIG. 8 is a time chart showing the parallel operations of the access to the memory cell and the access to the data buffer.

The READ operation and WRITE operation of the RAM to which the invention is applied have been described above. According to the construction of the invention, even if the access to the memory cell is not completed with respect to the READ operation, the access to the data buffer can be performed. The above operations will now be described with reference to the time charts in case of executing the parallel operations shown in FIG. 8. In FIG. 8, a portion shown by "a" in the time chart corresponds to the first READ operation and a portion shown by "b" corresponds to the third READ operation. The parallel operations can be executed in the case where the access to the memory cell shown by "a" is started (CS/RAS) and, after the elapse of two cycles, the access to the data buffer shown by "b" is executed. The read data can be outputted prior to accessing to the memory cell. This is because the COL address correspondence registers are separately prepared for the memory cell access 11 and the data buffer access 12. According to the above construction, thus, the out-of-order operation of the memory access can be also realized.

With respect to the WRITE operation, the parallel operations of the memory cell access and the data buffer access can be performed in a manner similar to the case of the READ operation mentioned above. This is because the registers 11/13/15 for memory cell access and the registers 12/14/16 for data buffer access are individually prepared.

Further, the parallel operations of the memory accesses can be also similarly processed not only in the case of both of the READ operations or both of the WRITE operations but also the mixture case of the READ operation and the WRITE operation.

In the embodiment of FIG. 1, although the data buffer in the RAM has been commonly used for reading and writing, different data buffers can be also provided for reading and writing in order to simplify the control on the memory apparatus side.

Figure 4:
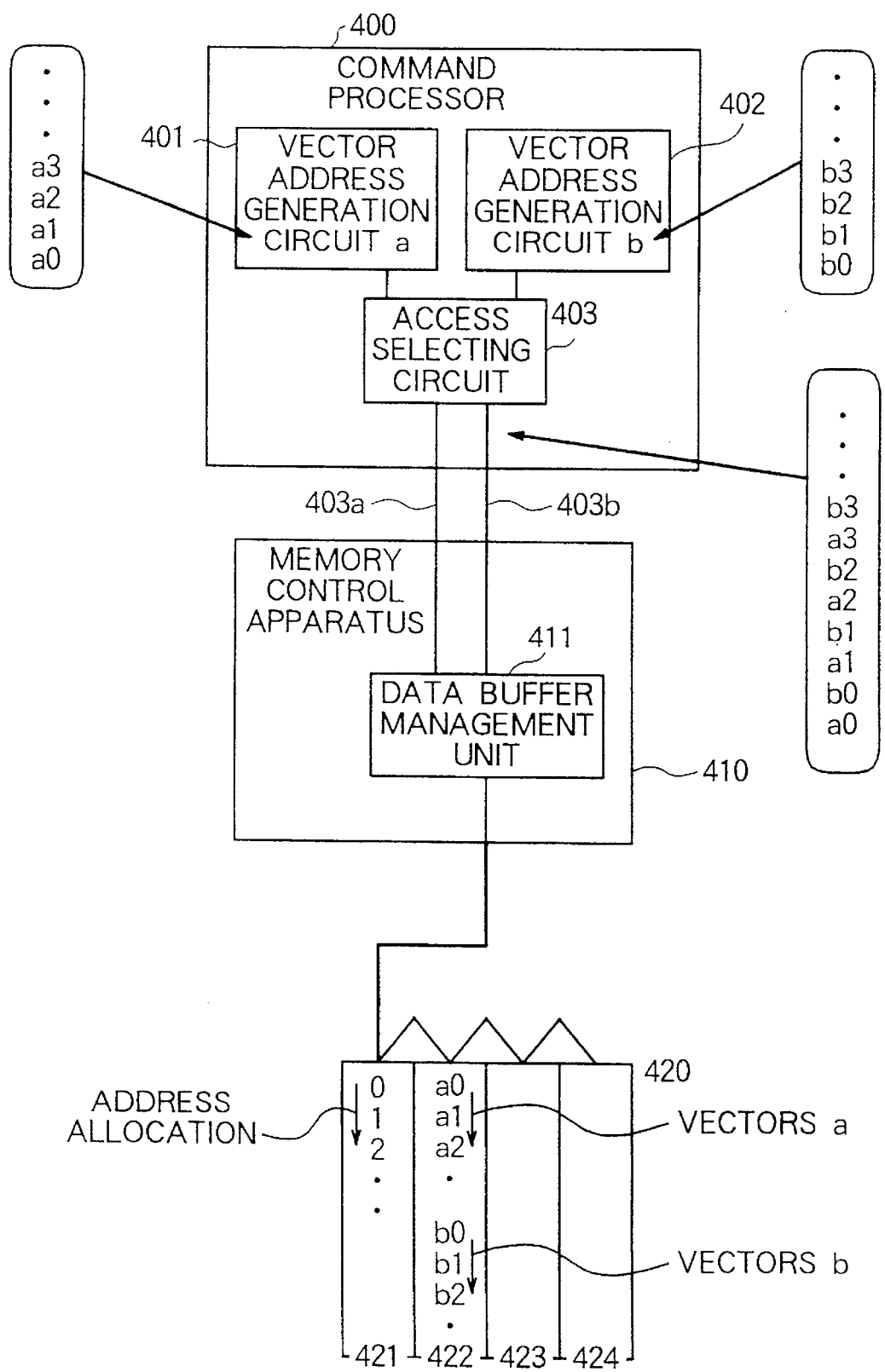
FIG. 4 is a system configuration diagram using an RAM proposed by the invention.

FIG. 4 shows a system configuration using the RAM proposed by the present invention shown in FIG. 1. Although the system corresponds to the configuration shown in FIG. 2, a construction of the memory control apparatus differs. An instruction processor 400 generates an access request in a form in which a plurality of access data steams mixedly exist. Namely, access requests shown in streams 401 and 402 pass through a selecting circuit 403 and are sent to a memory control apparatus 410 through a request signal line 403*b*.

Figure 2:
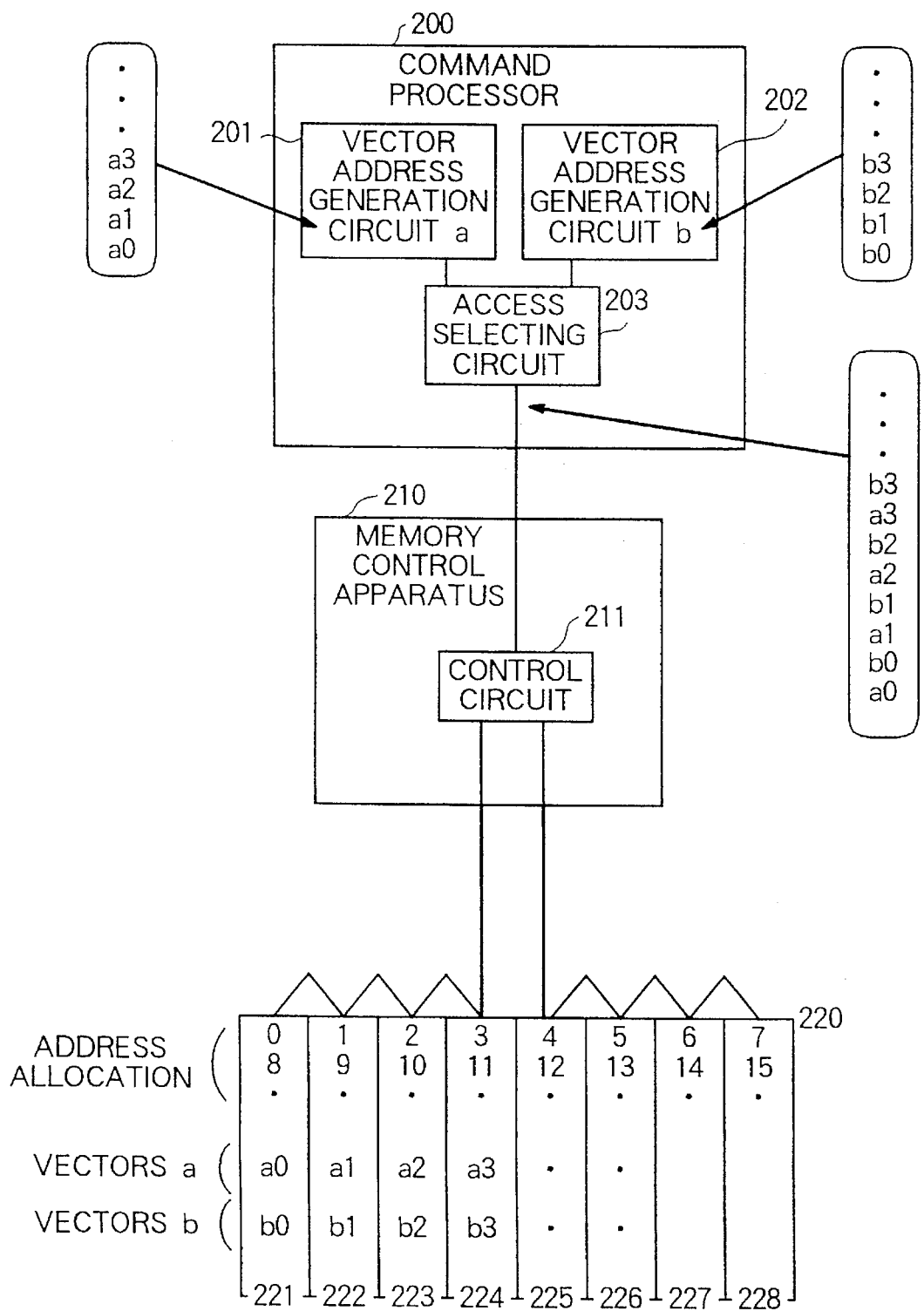
FIG. 2 is a system configuration diagram using a conventional synchronous DRAM.
Figure 3:
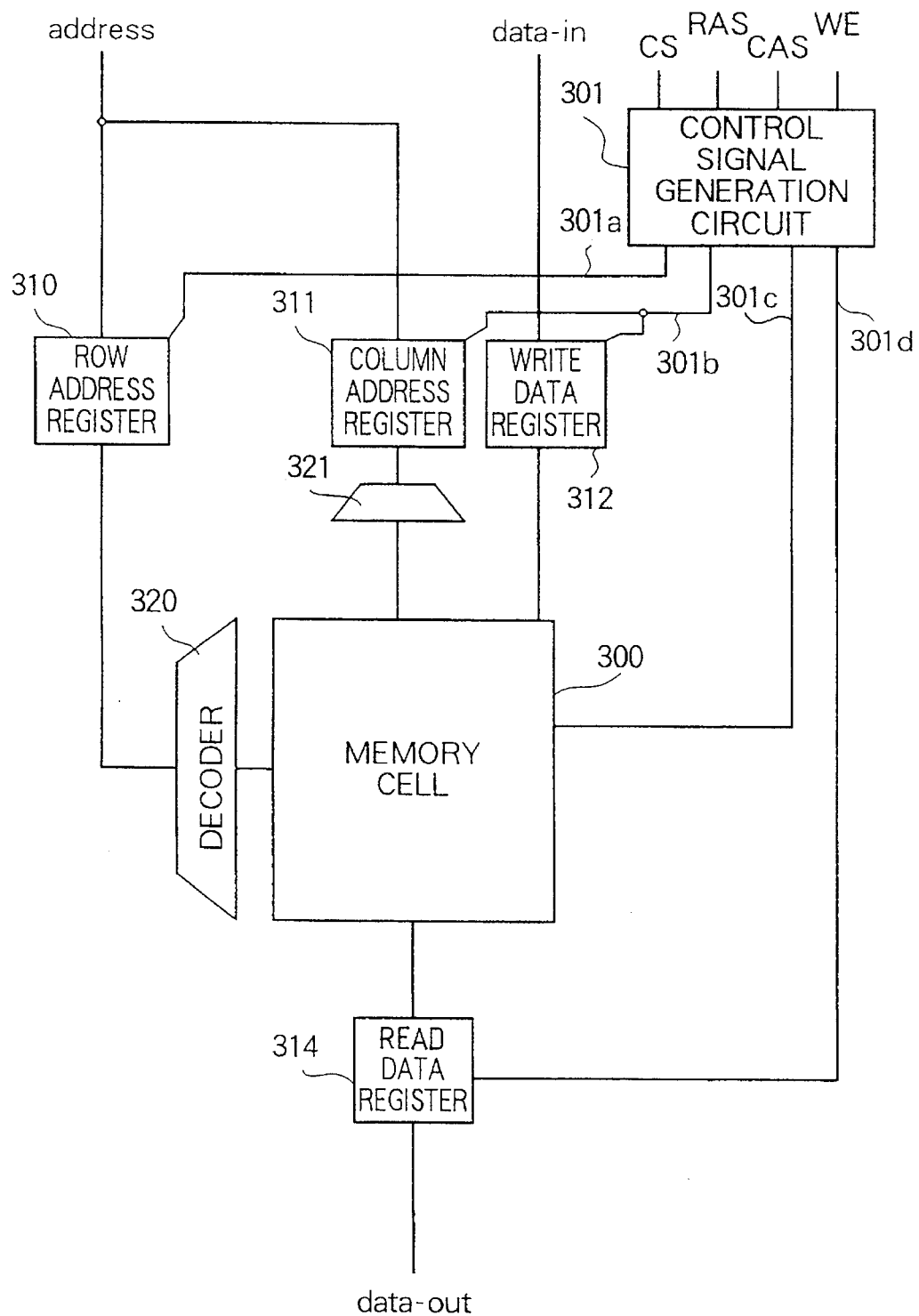
FIG. 3 is an internal constructional diagram of the conventional synchronous DRAM.

In the memory control apparatus 410, the system of FIG. 4 differs from the system shown in FIG. 2 with respect to the following points. Namely, information 403*a* indicating that the data of the memory cell should be stored into the data buffer in the RAM is supplied from the instruction processor. The system has a mechanism 411 for managing that the data of which address has been registered in the data buffer in the RAM and, in the case where an access to the registered data is generated, for obtaining the relevant data buffer number and supplying as BNO information to the RAM. In the system of FIG. 4, further, the number of RAMs constructing memory apparatuses 421 to 424 is reduced to four. However, so long as a memory capacity of the RAM is enough large as a system, even if the number of RAMs is further reduced to one, a performance similar to that in the case shown in FIG. 2 can be realized.

As a method of allocating the addresses to the RAMs, a method of sequentially allocating words 0, 1, 2, 3, . . . in accordance with the order into the RAMs is used instead of a method of allocating the addresses so as to move to the DRAMs every word addresses in FIG. 2. FIG. 4 shows a state in which data such as vectors (a) [a0, a1, a2, . . .], vectors (b) [b0, b1, b2, . . .], and the like is allocated to continuous areas in the RAM 422 by the method of allocating the continuous addresses to the same RAM. By such an address allocating method, the data of the vectors (a) or the data of the vectors (b) can be read out from the memory cells to the data buffers 50 to 53 existing in the same RAM. Therefore, when the vector data is once read out from the memory cell to the data buffer, the data in the data buffer can be accessed without accessing the memory cell which takes an access time longer than that of the data buffer. Thus, the data can be supplied to the memory control apparatus and to the instruction processor at a high speed. In this instance, by allocating the data of the vectors (a) and the data of the vectors (b) to the different data buffers in the RAM, even if the data of the vectors (a) and the vectors (b) is alternately accessed, it is unnecessary to read out the vector data from the memory cell to the data buffer each time. Therefore, the data of the vectors (a) and the data of the vectors (b) can be read out at a high speed.

Figure 7:
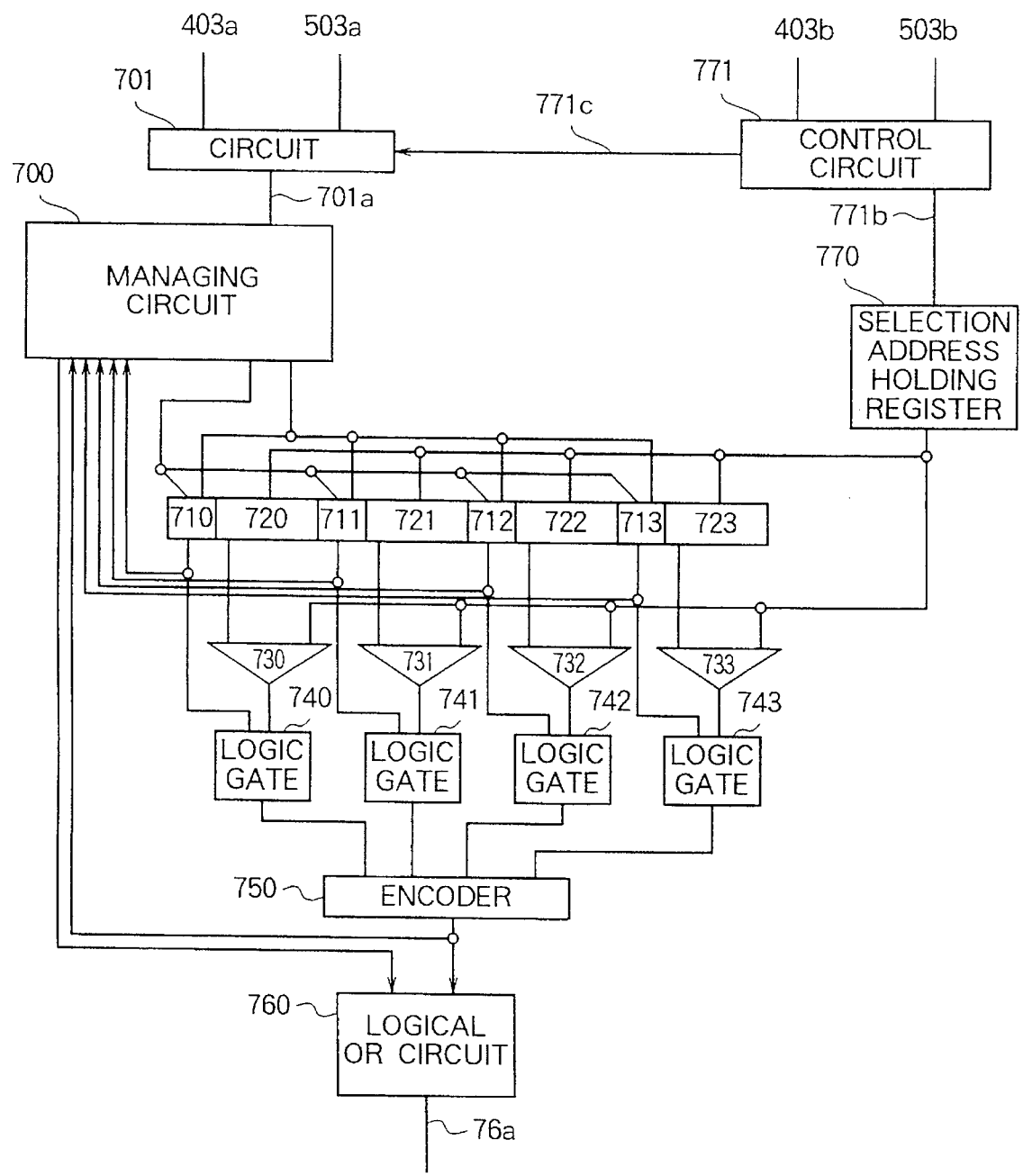
FIG. 7 is a constructional diagram of a managing mechanism to manage data buffers in the RAM proposed by the invention.

FIG. 7 shows the details of the data buffer managing mechanism 411 of the RAMs constructing the memory apparatus. The operation will now be described hereinbelow. FIG. 7 shows a construction in the case where there are a plurality of (two) processors. The signal lines 403a and 403b are led out from one processor. Signal lines 503a and 503b are led out from another processor. The signal lines 403a and 503a are inputted to a circuit 701. The signal lines 403b and 503b are inputted to a control circuit 771. The control circuit 771 solves a competition of requests on the signal lines 403b and 503b and outputs as a request 771b to the downstream and also generates a signal 771c, thereby instructing the circuit 701 to select either one of the signal lines 403a and 503a.

Explanation will now be made on the basis of the accesses from the processors on the 403a and 403b side. The case of newly registering into the data buffer will be first described. When an instruction to register is received from the processor through the signal line 403a, a managing circuit 700 judges whether the data is the data which has already been registered in the data buffer or not by comparing the address 403b (of an amount of bits corresponding to the row address in the RAM) sent from the processor and the values of address registers 720 to 723 indicative of the row addresses of the data which has already been registered in the data buffer by comparators 730 to 733 and 740 to 743. The address registers 720 to 723 are the registers each for managing that the data of which address has been registered in the data buffer in the RAM and their contents are updated when the new data is registered into the data buffer, namely, in the case where a request which needs a new data registration is generated from the processor to the data buffer.

When the address 403b doesn't coincide with the values of the address registers 720 to 723, the contents in valid information registers 710 to 713 each of which are provided in correspondence to the address registers 720 to 723 and indicates whether the data exists in the data buffer or not are checked. If there is a space, the data is allocated to the empty buffer position. If there is no space, the data buffer position to be registered is determined by an algorithm such as to replace the data in which a frequency at which it is referred is small or the like. A registering instruction is sent to a memory apparatus (RAM) through a logical OR circuit 760. The contents of the valid information registers 710 to 713 are initialized by the managing circuit 700 and are set in the case where the address registers 720 to 723 are updated.

On the other hand, when the address 403b coincides with the values of the address registers 720 to 723, namely, in the case where a fact that the accessed data has already been registered in the data buffer is detected by the comparators 730 to 743 and 740 to 743, the data buffer position information is encoded by an encoder 750 and is sent as BNO information 76a to the memory apparatus (RAM) through the logical OR circuit 760.

By the above construction, the memory control apparatus can manage the data buffer positions in the RAM constructing the memory apparatus.

The configuration and operation to improve the accessing efficiency in the same processor shown in FIG. 4 have been described above. However, in case of considering as a system, an accessing efficiency among a plurality of processors can be also improved. Among a plurality of processors, a processor like an input/output processor which is not accompanied with any arithmetic operating process can also exist.

Figure 9:
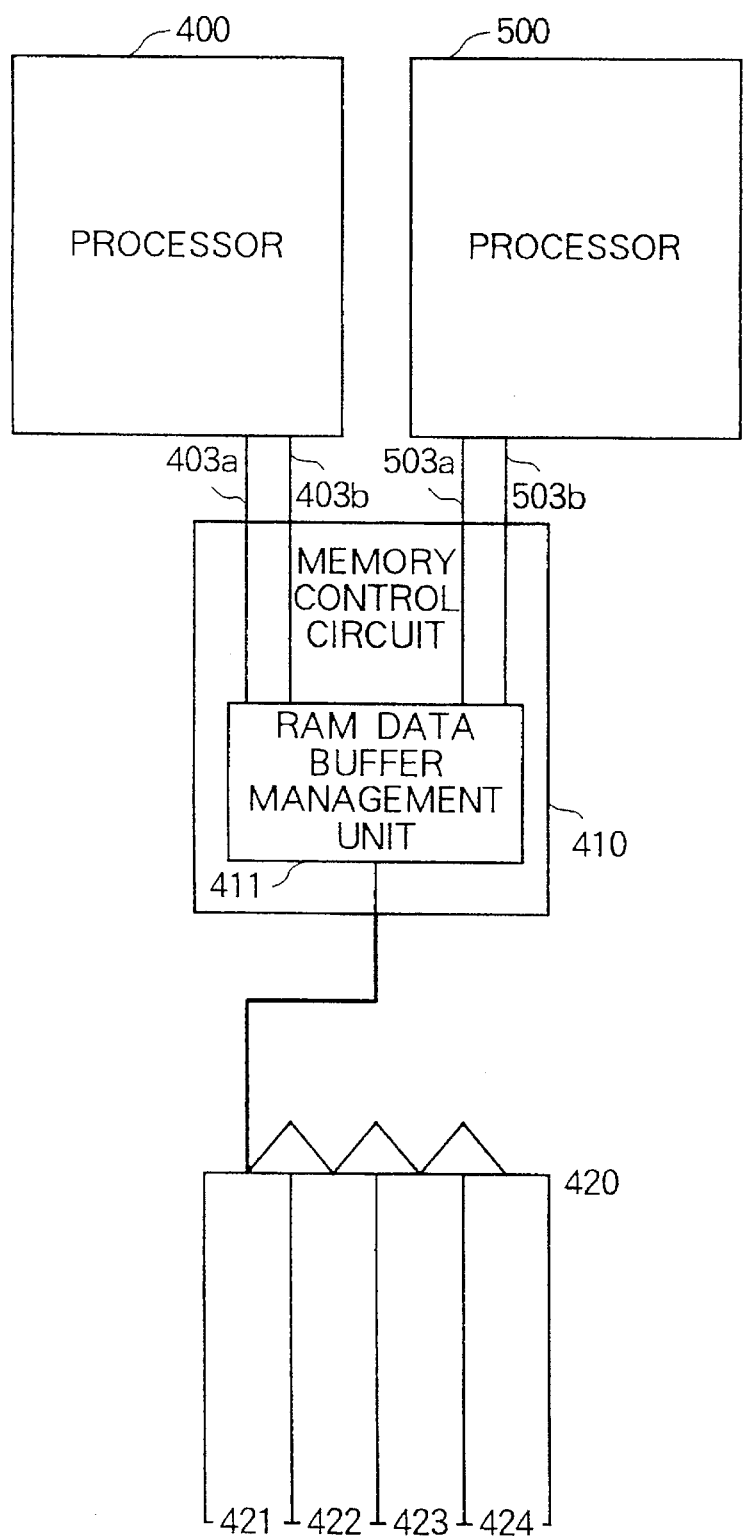
FIG. 9 is a constructional diagram to which the invention is applied to a system comprising a plurality of processors.

FIG. 9 shows a construction in which the mechanism of the invention is applied to a plurality of processors. A case where the processor 400 refers to information from a processor 500 can be mentioned as an effective example in which the invention is applied to such a system comprising a plurality of processors. When information on a memory 420 is updated, the processor 500 instructs the registration into the data buffer in the memory 420 by the signal line 503a. In the case where the processor 400 refers to the relevant data just after, consequently, it is sufficient to access to the data buffer without needing to access to the memory cell. Thus, the access time can be reduced. The same shall also apply to the case where the processor 400 updates and the processor 500 refers.

Figure 10:
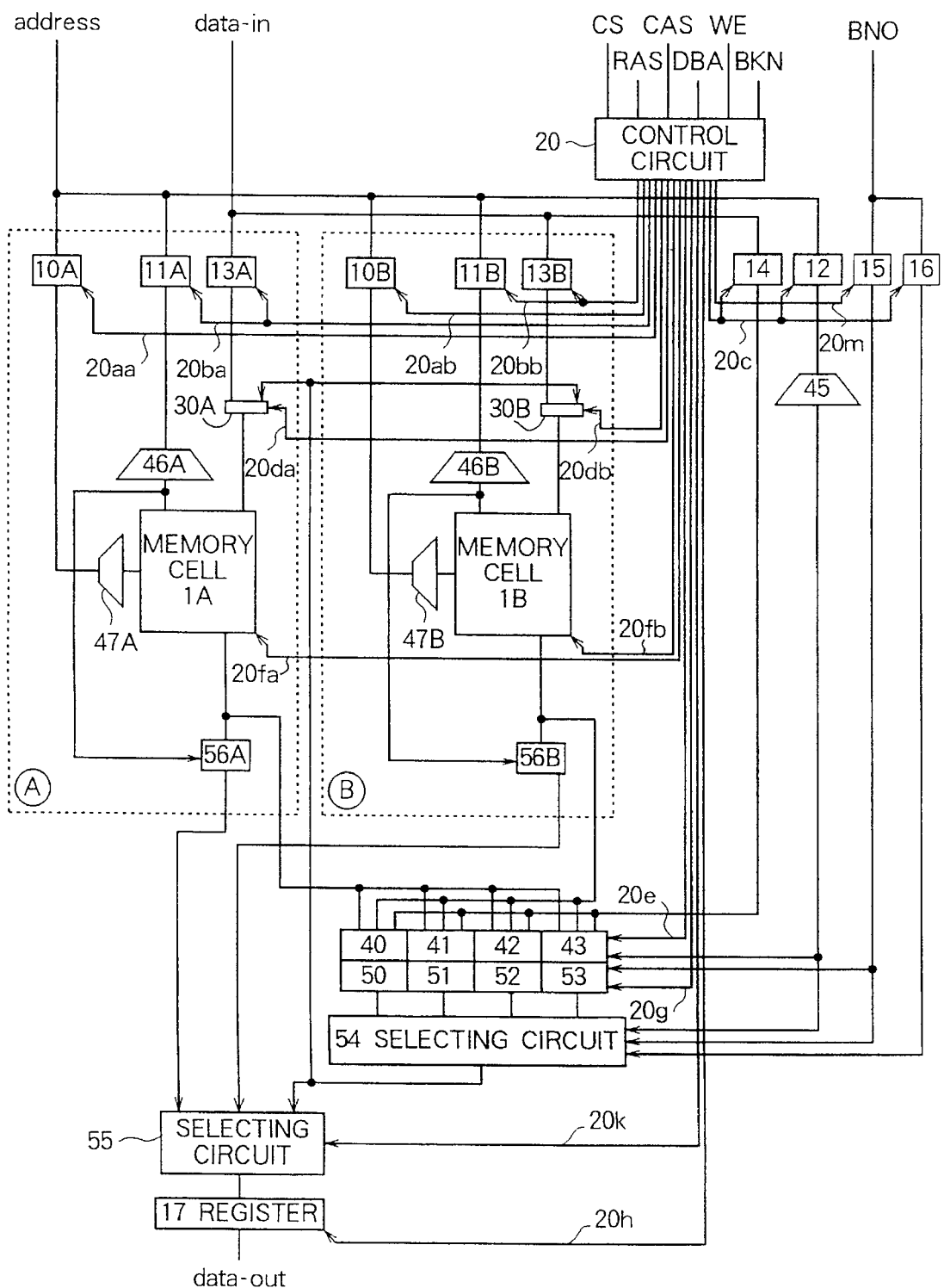
FIG. 10 is an internal constructional diagram in the case where the invention is applied to an RAM having a plurality of banks.

FIG. 10 shows a configuration in the case where the invention is applied to a synchronous DRAM in which a plurality of banks are built in a chip. Column-address registers 11A and 11B, row-address registers 10A and 10B, registers 13A and 13B for write data, row-address decoders 47A and 47B, column-address decoders 46A and 46B, selecting circuits 30A and 30B for selecting the data from the row correspondence data buffers and the registers for write data, and selecting circuits 56A and 56B for selecting the data read out from the memory cell by the column address which correspond to memory cells 1A and 1B are provided in correspondence to the memory cells in correspondence to the mechanisms in FIG. 1, respectively. This is because it is necessary that each memory cell can independently operate.

On the other hand, the row correspondence data buffers 50 to 53 are shared among a plurality of banks. Therefore, the data buffers 50 to 53, the circuit 54 for selecting the data from the plurality of data buffers in accordance with the data buffer number, the column-address register 12 and decoder 45 for accessing the data buffer, the data register 14 for updating the data buffer, the buffer number registers 15 and 16, data selecting circuits 40 to 43 to the data buffer, the circuit 55 to select the data from the memory cell and data buffer, and the read data register 17 are shared among a plurality of banks.

The synchronous DRAM of FIG. 10 differs from the RAM shown in FIG. 1 with respect to the following points. Namely, a mechanism to instruct which one of the memory cells 1A and 1B is selected by "BKN" upon activation of the operation by the CS is provided as an RAM interface. On the basis of such information, whether the bank of the A system is accessed or the bank of the B system is accessed is determined. A control signal from the control circuit 20 is transmitted. Consequently, the row correspondence data buffers can be shared between the banks. As compared with the conventional synchronous DRAM, an increase in amount of logical circuits can be minimized and the invention can be applied.

According to the invention, the register for holding the address to access the memory cell and the register for address to access the row correspondence data buffer are separately provided in the memory device (RAM). Therefore, the access to the row correspondence data buffer can be performed in parallel with the access to the preceding memory cell. It is possible to provide the memory device which can efficiently access even in the case where the access to the row correspondence data buffer and the access to the memory cell mixedly exist.

The memory device of the invention comprises: a plurality of data buffers each for holding a part or all of the data read out from the memory cell by the row address; the selecting circuit for selecting the outputs from the plurality of memory cell group and inputting to the relevant buffer or the bus for writing the data from the relevant buffer to the memory cell group; the interface to designate the relevant row correspondence buffer from the outside; and the bus for accessing to the position that is designated by the column address of the row correspondence buffer designated by the interface. Therefore, the data at the designated position can be accessed at a high speed and the invention can be applied to a system which needs a high speed access.

According to the invention, in the data processing system comprising the processor, memory control apparatus, and memory device having the memory cell and data buffer, the system has the interface for notifying from the processor to the memory control apparatus the information indicating whether the data to be accessed by the processor should be registered into the data buffer in the memory device from the memory cell in the memory device. The memory control apparatus also has the control means for registering the relevant data into the data buffer from the memory cell on the basis of such information. Therefore, in the case where the access addresses are discontinuous (scalar variables or the like), the processor transmits the instruction not to register the data from the memory cell to the data buffer to the memory control apparatus through the interface. In the case where the access addresses are continuous (vector variables or the like), the processor transmits the instruction to register the data from the memory cell to the data buffer to the memory control apparatus through the interface. The data processing system, consequently, can provide an efficient access even in the case where the access of the vector variables and the access of the scalar variables mixedly exist.

According to the invention, in the data processing system comprising a plurality of processors, memory control apparatus, and memory device having a memory cell and a data buffer, the system has the interface to notify to the memory control apparatus the information indicating whether it is desirable on a system performance to set the data to be set from the processor to the memory device into the data buffer or not. The memory control apparatus has a function to decide the allocation control to the data buffer on the basis of such information. Therefore, in the case where the second processor such as an input/output control apparatus or the like judges that a possibility such that the first processor refers to the data set in the memory device is high, the second processor can inform the memory control apparatus through the interface of the fact that it is desirable to set the data to the data buffer of the memory device. Thus, since the data is set into the data buffer of a short access time by the memory control apparatus, the data can be transmitted and received among a plurality of processors at a high speed.

According to the invention as described above, like "pseudo vector processor" or "microvector processor", the individual accesses are not handled as independent accesses in the processes in the case where a plurality of continuous streams essentially mixedly exist, but by using a fact that the access addresses from the processor to the memory apparatus have a dependency on the time base direction of the access, the system can be constructed by the memory apparatus of a small interleave construction. Quantitatively, so long as an access from the processor is generated in each machine cycle and the cycle time of the RAM constructing the memory apparatus is set to eight machine cycles and the cycle time of the access of the data fetched in the data buffer in the RAM is equal to one machine cycle, the similar performance can be realized by an amount of component elements that is ⅛ of that of the conventional construction.

What is claimed is:

1. A memory device comprising:

a memory cell accessed by a row address and a column address;

a plurality of data buffers for storing row data designated by an arbitrary row address and read out from said memory cell;

designation means for designating one of said data buffers;

a first address register for holding a first address used for accessing said memory cell;

a second address register for holding a second address used for accessing said data buffers;

a first path for reading out positional data designated by a row address and a column address; and a second path for reading out positional data designated by a column address from row data stored in the one of said data buffers designated by said designation means, wherein an access to said memory cell using said first address register and an access to said data buffers using said second address register are performed in parallel.

2. A device according to claim 1, wherein in the access to the memory cell, the address is set to the row address and the column address and in the access to the data buffer, the address is set to the row address and a data buffer identifier indicative of said designated data buffer.

3. A device according to claims 2, wherein said column address and said data buffer identifier are simultaneously supplied to said memory device.

4. A device according to claim 2, wherein an external terminal of said memory device to receive said column address and an external terminal of said memory device for receiving said data buffer identifier are different terminals.

5. A memory device according to claim 1 comprising:

a third path for providing renewal data to said memory cell to renew positional data stored in said memory cell and designated by a row address and a column address; and a fourth path for providing renewal data to a data buffer designated by said designation means to renew positional data designated by a column address from row data stored in said data buffer.

6. A memory device comprising:

a memory cell accessed by a row address and a column address;

a data buffer for storing row data designated by an arbitrary row address and read out from said memory cell;

a first address register for holding a first address used for accessing said memory cell;

a second address register for holding a second address used for accessing said data buffer;

a first path for reading out positional data designated by a row address and a column address from said memory cell; and a second path for reading out positional data designated by a column address from row data stored in said data buffer, wherein an access to said memory cell using said first address register and an access to said data buffer using said second address register are performed in parallel.

7. A device according to claim 6, wherein in the access to the memory cell, the address is set to the row address and the column address and in the access to the data buffer the address is set to the row address and a data buffer identifier indicative of said designated data buffer.

8. A device according to claim 7, wherein said column address and said data buffer identifier are simultaneously supplied to said memory device.

9. A device according to claim 7, wherein an external terminal of said memory device to receive said column address and an external terminal of said memory device to receive said data buffer identifier are different terminals.

10. A memory device according to claim 7 comprising:

a third path for providing renewal data to said memory cell to renew positional data stored in said memory cell and designated by a row address and a column address; and a fourth path for providing renewal date to said data buffer to renew positional data designated by a column address from a row data stored in said data buffer.

11. A memory device comprising:

a plurality of memory cells accessed by a row address and a column address independently of each other;

a plurality of data buffers for storing row data read out from a memory cell arbitrarily designated by a row address;

designation means for designating one of said data buffers;

a plurality of first address registers disposed correspondingly to said memory cells for holding first addresses used for accessing said memory cells;

a second address register for holding a second address used for accessing said data buffers;

a plurality of first paths disposed correspondingly to said memory cells for reading out positional data stored in said memory cells and designated by a row address and a column address; and a second path for reading out positional data designated by a column address from row data stored in a data buffer designated by said designation means, wherein accesses to said memory cells using said first address registers and accesses to said data buffers using said second address register are performed in parallel.

12. A memory device according to claim 11 comprising:

a plurality of third paths disposed correspondingly to said memory cells for providing renewal data to said memory cells to renew positional data stored in said memory cells and designated by a row address and a column address; and a fourth path for providing renewal data to said data buffer designated by said designation means to renew positional data designated by a column address from row data stored in said data buffer.

13. A memory device comprising:

a plurality of memory cells accessed by a row address and a column address independently of each other;

a data buffer for storing row data read out from a memory cell arbitrarily designated by a row address;

a plurality of first address registers disposed correspondingly to said memory cells for holding first addresses used for accessing said memory cells;

a second address register for holding a second address used for accessing said data buffer;

a plurality of first paths disposed correspondingly to said memory cells for reading out positional data stored in said memory cells and designated by a row address and a column address; and a second path for reading out positional data designated by a column address from row data stored in said data buffer, wherein accesses to said memory cells using said first address registers and accesses to said data buffer using said second address register are performed in parallel.

14. A memory device according to claim 13 comprising:

a plurality of third paths disposed correspondingly to said memory cells for providing renewal data to said memory cells to renew positional data stored in said memory cells and designated by a row address and a column address; and a fourth path for providing renewal data to said data buffer to renew positional data designated by a column address from a row data stored in said data buffer.

* * * * *

UNITED STATES PATENT AND TRADEMARK OFFICE
CERTIFICATE OF CORRECTION

PATENT NO. : 5,602,781
DATED : February 11, 1997
INVENTOR(S) : Tadaaki Isobe

It is certified that error appears in the above-indentified patent and that said Letters Patent is hereby corrected as shown below:

Title page,
item [73] Assignee: delete -- Hitachi, Inc., Tokyo, Japan -- and insert -- Hitachi, Ltd., Tokyo, Japan --

Signed and Sealed this

Thirteenth Day of January, 1998

Attest:

BRUCE LEHMAN

Attesting Officer

Commissioner of Patents and Trademarks